United States Patent
Fujisawa et al.

(10) Patent No.: US 6,602,606 B1
(45) Date of Patent: Aug. 5, 2003

(54) GLASS SHEET WITH CONDUCTIVE FILM, METHOD OF MANUFACTURING THE SAME, AND PHOTOELECTRIC CONVERSION DEVICE USING THE SAME

(75) Inventors: Akira Fujisawa, Osaka (JP); Masahiro Hirata, Osaka (JP); Koichiro Kiyohara, Osaka (JP); Tsuyoshi Otani, Osaka (JP); Yasunori Seto, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 09/573,736

(22) Filed: May 18, 2000

(30) Foreign Application Priority Data

| May 27, 1999 | (JP) | 11-148102 |
| May 18, 1999 | (JP) | 11-137659 |
| May 18, 1999 | (JP) | 11-137660 |
| Mar. 22, 2000 | (JP) | 2000-080956 |
| Mar. 22, 2000 | (JP) | 2000-080957 |
| Mar. 22, 2000 | (JP) | 2000-080962 |

(51) Int. Cl.$^7$ .................. B32B 17/00; H01L 31/00
(52) U.S. Cl. ............... 428/432; 428/336; 428/702; 136/243; 136/252
(58) Field of Search ................. 428/426, 432, 428/689, 697, 699, 701, 702, 336; 136/243, 252; 250/208.1, 214.1, 214

(56) References Cited

U.S. PATENT DOCUMENTS

| 4,325,987 A | 4/1982 | Kalbskopf et al. ........ 427/110 |
| 4,808,462 A * | 2/1989 | Yaba et al. ............. 428/142 |
| 5,041,150 A | 8/1991 | Grundy et al. .......... 65/60.51 |
| 5,698,262 A | 12/1997 | Soubeyrand et al. .... 427/255.3 |

FOREIGN PATENT DOCUMENTS

| EP | 0216703 A2 * | 4/1987 |
| JP | 55-56041 A | 4/1980 |
| JP | 56-24708 | 3/1981 |
| JP | 36127946 A * | 10/1986 |
| JP | 363195149 A * | 8/1988 |
| JP | 63-242947 A | 10/1988 |
| JP | 1-259572 A | 10/1989 |
| JP | 402126520 A * | 5/1990 |
| JP | 402168507 A * | 6/1990 |
| JP | 2-175631 | 7/1990 |
| JP | 2-181473 A | 7/1990 |
| JP | 4-502305 | 4/1992 |
| JP | 406252431 A * | 9/1994 |
| JP | 8-508006 | 8/1996 |
| JP | 411026797 A * | 1/1999 |
| WO | WO 91/05743 | 5/1991 |
| WO | WO 95/18771 | 7/1995 |

* cited by examiner

Primary Examiner—Deborah Jones
Assistant Examiner—Stephen Stein

(57) ABSTRACT

On a glass sheet, an undercoating layer and a conductive film containing tin oxide as a main component are formed suitably in this order. On the conductive film, a photoelectric conversion unit and a back electrode are formed, thus obtaining a thin film photoelectric conversion device. In the present invention, the absorption coefficient of this conductive film is decreased up to $1.2 \times 10^3$ cm$^{-1}$ or less. In another embodiment of the present invention, the chlorine concentration in a conductive film is set to be 0.11 wt. % or lower and the fluorine concentration in the conductive film is equal to or higher than the chlorine concentration. In still another embodiment, in a wavelength of 550 nm, a conductive film is formed so that a glass sheet with a conductive film has a transmittance of at least 79% and a haze ratio of at least 4%.

14 Claims, 3 Drawing Sheets

GLASS SHEET WITH CONDUCTIVE FILM, METHOD OF MANUFACTURING THE SAME, AND PHOTOELECTRIC CONVERSION DEVICE USING THE SAME

FIELD OF THE INVENTION

The present invention relates to a glass sheet with a conductive film, a method of manufacturing the same, and a photoelectric conversion device, such as a solar cell or the like, using the same.

BACKGROUND OF THE INVENTION

Generally, a thin film photoelectric conversion device includes a transparent conductive film containing tin oxide as a main component, a thin film silicon layer as a photovoltaic layer, and a back electrode of aluminum or the like, which are formed on a glass substrate in this order. In such a configuration, the transparent conductive film positioned on a window side from which light is introduced into the photovoltaic layer is required to have high light transmittance. It also is required to have high conductivity (low resistance) in view of its function as an electrode. Furthermore, it has been known that when the transparent conductive film is formed to have a surface with roughness, the introduced light can be used efficiently due to a so-called "light trapping effect". The degree of the roughness formed at the surface of the transparent conductive film can be indicated by a haze ratio.

As the transparent conductive film, a fluorine doped tin oxide (hereinafter referred to as "$SnO_2$:F") film has been used in many cases. This film is more excellent in chemical stability such as plasma resistance or the like compared to a tin doped indium oxide (ITO) film. Therefore, the $SnO_2$:F film does not deteriorate greatly in forming a photovoltaic layer (a thin film silicon layer) by using a plasma CVD method. The $SnO_2$:F film is formed to have a certain thickness in order to decrease its sheet resistance to a value that is desirable for an electrode, although its sheet resistance is intended to be decreased by doping with fluorine. Therefore, in order to improve the conversion efficiency of the photoelectric conversion device, it is necessary to improve the light transmittance in view of the thickness of the $SnO_2$:F film.

For instance, JP 1-259572 A describes that the light absorption of a transparent conductive film is suppressed by setting the concentration of chlorine introduced into a $SnO_2$:F film from raw materials in forming the film to be 0.40 wt. % or lower. The specific chlorine concentration described therein is 0.12 to 0.36 wt. %. A glass sheet used therein is a soda-lime glass sheet precut to have a predetermined size.

JP 2-181473 A describes that the plasma resistance of a $SnO_2$:F film is improved by adjusting levels of trace components in the $SnO_2$:F film. JP 2-181473 A discloses that fluorine in the film deteriorates the plasma resistance of the $SnO_2$:F film more than the chlorine in the film does. JP 2-181473 A also describes a $SnO_2$:F film in which the fluorine concentration is 0.04 to 0.2 wt. % and the chlorine concentration is 0.4 wt. % or lower. In a film with a low chlorine concentration, the fluorine concentration is adjusted to be further lower than the chlorine concentration. Further, as a heating temperature of a glass sheet, a temperature of 550° C. is described as an example. The glass sheet used therein also is a soda-lime glass sheet precut to have a predetermined size.

However, the influences of film formation conditions and trace components other than chlorine on the light transmittance of a conductive film such as a $SnO_2$:F film have not been clarified.

Further, the following problem has been pointed out. In a thin film photoelectric conversion device, defect levels are formed in an amorphous silicon-based photovoltaic layer due to light irradiation, thus decreasing a photoelectromotive force. Recently, therefore, an amorphous silicon-based photovoltaic layer tends to be formed to be thin. However, in the above-mentioned conventional $SnO_2$:F film, components other than chlorine and characteristics of the film have not been adjusted to satisfy the characteristics required for the silicon-based photovoltaic layer with a reduced thickness.

Further, the light trapping effect by a transparent conductive film becomes more important in a thinner photovoltaic layer. Therefore, the transparent conductive film is required to have a high haze ratio in addition to a low absorptance for achieving a high light transmittance. In order to increase the haze ratio, the thickness of the film may be increased.

However, the simple increase in film thickness results in the increase in absorption of the film.

The absorptance and the haze ratio of the $SnO_2$:F film are affected by manufacturing conditions and raw materials. One of the typical raw materials used for forming a tin oxide film by a CVD method is tetramethyltin. For instance, JP 55-56041 A discloses a method of forming a tin oxide film by pyrolysis of a mixed gas containing tetramethyltin and oxygen. This mixed gas contains about 1% tetramethyltin and about 20% oxygen. Since tetramethyltin has a high reactivity, the control of film formation is not easy.

JP 2-175631 A and JP 8-508006 A disclose a method of forming a tin oxide film with a mixed gas containing tin tetrachloride and dry air. Since tin tetrachloride has a high reactivity with respect to water, the dry air is used as a gas for oxidizing the tin tetrachloride. Further, JP56-24708 A describes that hydrogen is added as a reductant for suppressing the reaction between tin tetrachloride and water.

Materials that can be handled more easily than those tin materials include organic tin chlorides such as dimethyltin dichloride, monobutyltin trichloride, and the like. For instance, JP 4-502305 A discloses a method of forming a film using dimethyltin dichloride and describes a mixed gas containing dimethyltin dichloride, oxygen, water, and nitrogen. This mixed gas is indicated to have a volume ratio of dimethyltin dichloride:oxygen:water:nitrogen= 50:50:23:250.

JP 63-242947 A describes an example in which the haze ratio of a tin oxide film is varied by adjusting the mole ratio of dimethyltin dichloride and water. Oxygen is not added simultaneously.

U.S. Pat. No. 5,698,262 describes a method of doping a tin oxide film with fluorine using not trifluoroacetic acid or the like but hydrogen fluoride in order to obtain low and uniform sheet resistance. The mixed gas disclosed therein contains dimethyltin dichloride, oxygen, water, hydrogen fluoride, and helium. The concentrations of oxygen and water vapor are 10 to 60 mol % and 2 to 50 mol %, respectively. In the examples and comparative examples, the concentration of dimethyltin dichloride (vapor) is described as about 2.5 mol %. However, the thickness (320 nm) of the $SnO_2$:F film disclosed therein limits the size of crystal grains, thus preventing the film surface from having great irregularities. Therefore, a high haze ratio cannot be obtained.

SUMMARY OF THE INVENTION

The present invention is intended to provide a glass sheet with a conductive film having a higher light transmittance than that in a conventional one and a method of manufacturing the same, by directing attention not only to chlorine but also to trace components other than that.

Another object of the present invention is to provide a glass sheet with a conductive film that can be used suitably even when a photoelectric conversion layer is thin. Particularly, the present invention is intended to provide a glass sheet with a conductive film having both a low light absorptance and a high haze ratio and a method of manufacturing the same.

Furthermore, still another object of the present invention is to provide a photoelectric conversion device such as a photovoltaic device using any one of the above-mentioned glass sheets.

The present inventors found that especially the concentrations of fluorine and carbon in a conductive film containing tin oxide as a main component affected the light transmittance of the conductive film. The present inventors also found that an oxygen concentration in the atmosphere in forming the conductive film affected the light transmittance. By controlling these conditions suitably, the absorption coefficient of the conductive film containing tin oxide as the main component can be decreased compared to that of a conventional one.

A first glass sheet with a conductive film of the present invention includes a glass sheet and a conductive film containing tin oxide as a main component formed on the glass sheet. In the first glass sheet with a conductive film, the conductive film has an absorption coefficient of $1.2 \times 10^3$ $cm^{-1}$ or less in a wavelength region between 400 nm and 1100 nm.

In the present specification, the absorption coefficient denotes a coefficient k ($cm^{-1}$) in a relative equation of $I = I_0 \cdot e^{-kd}$, by which when incident light with an intensity $I_0$ that has entered a thin film travels in its thickness direction for a distance d(cm) to have an intensity I, I and $I_0$ are expressed.

It is preferable that the absorption coefficient of the conductive film is $0.7 \times 10^3$ $cm^{-1}$ or less in the wavelength region between 500 nm and 900 nm, particularly $0.7 \times 10^3$ $cm^{-1}$ or less in a wider wavelength region between 400 nm and 900 nm.

Preferably, the fluorine concentration in the conductive film is 0.1 wt. % or lower, further preferably 0.08 wt. % or lower, since an excessively high fluorine concentration results in an excessively high absorption coefficient of the conductive film. On the other hand, it is preferable that the fluorine concentration in the conductive film is at least 0.03 wt. %, further preferably at least 0.05 wt. %, since an excessively low fluorine concentration results in an excessively low specific resistance of the conductive film.

When the carbon concentration in the conductive film is expressed by a ratio of carbon atoms to tin atoms (a C/Sn atom ratio), it is preferable that the ratio is 0.015 or less, more preferably 0.010 or less, and particularly preferably 0.007 or less, since an excessively high carbon concentration results in an excessively high absorption coefficient of the conductive film.

It is preferable that the conductive film is formed by a pyrolytic oxidation reaction in an atmosphere with an oxygen concentration of at least 10 vol. %. The reason is that it is disadvantageous in decreasing the absorption coefficient of the conductive film if carbon contained in the tin material is not decomposed and thus remains in the film.

A first method of manufacturing a glass sheet with a conductive film of the present invention is characterized as follows. By a pyrolytic oxidation reaction in an atmosphere with an oxygen concentration of at least 10 vol. %, a conductive film containing tin oxide as the main component and having an absorption coefficient of $1.2 \times 10^3$ $cm^{-1}$ or less in the wavelength region between 400 nm and 1100 nm is formed on glass, specifically on a glass sheet or a glass ribbon during manufacture of a glass sheet.

In the manufacturing method, it is preferable that the conductive film is formed by a pyrolytic oxidation reaction in an atmosphere including oxygen with a volume ratio of at least 15 vol %. According to this preferable example, the absorption coefficient of the conductive film can be suppressed to be $0.7 \times 10^3$ $cm^{-1}$ or less in the wavelength region between 500 nm and 900 nm.

In the manufacturing method, it is preferred to form the conductive film on a glass sheet or a glass ribbon having a temperature of at least 590° C. by the pyrolytic oxidation reaction.

In the glass sheet with a conductive film according to the present invention, it is preferred to form the conductive film via an undercoating film on a glass sheet. When an alkaline component contained in the glass sheet diffuses in the conductive film, characteristics such as conductivity or the like of the conductive film may be deteriorated in some cases. When the undercoating film is formed, diffusion of the alkaline component from the glass sheet into the conductive film can be suppressed. Therefore, the formation of the undercoating film is advantageous in obtaining the compatibility between a high light transmittance and a high conductivity in the conductive film.

The present invention also provides a glass sheet with a conductive film that can be used suitably even when a photoelectric conversion layer is thin.

A second glass sheet with a conductive film includes a glass sheet and a conductive film containing tin oxide as a main component formed on the glass sheet. In the second glass sheet with a conductive film, the chlorine concentration in the conductive film is 0.11 wt. % or lower and the fluorine concentration in the conductive film is equal to or higher than the chlorine concentration.

A third glass sheet with a conductive film of the present invention includes a glass sheet and a conductive film containing tin oxide as a main component formed on the glass sheet. In the third glass sheet with a conductive film, the chlorine concentration in the conductive film is 0.11 wt. % or lower and the fluorine concentration in the conductive film is at least 0.05 wt. %

According to each glass sheet with a conductive film described above, the conductive film is formed so that the glass sheet with a conductive film has a light transmittance of at least 79%, preferably at least 80%, with respect to incident light with a wavelength of 550 nm entering from the glass sheet side when the glass sheet is a soda-lime silica glass sheet with a thickness of 5 mm. In this case, the light transmittance denotes a total transmittance. While the glass sheet with a conductive film has such a high light transmittance, at least a predetermined amount of fluorine is contained in the conductive film. Therefore, the sheet resistance of the film can be decreased easily to be in a preferable range.

Specifically, it is preferable that the glass sheet with a conductive film has a light transmittance of at least 79% and is provided with a conductive film having a sheet resistance of 20 Ω/sq. (Ω/□) or lower.

In the glass sheet with a conductive film, it is preferable that the conductive film is formed so that the glass sheet with a conductive film has a light transmittance of at least 79% with respect to incident light with a wavelength of 550 nm entering from the glass sheet side and the haze ratio in the wavelength is at least 4% when the glass sheet is a soda-lime silica glass sheet with a thickness of 5 mm. According to this preferable example, even when the thickness of the photoelectric conversion layer is reduced, light can be used efficiently due to the "light trapping effect".

A fourth glass sheet with a conductive film of the present invention for achieving such efficient use of light includes a glass sheet and a conductive film containing tin oxide as a main component formed on the glass sheet. In the fourth glass sheet with a conductive film, the chlorine concentration in the conductive film is 0.11 wt. % or lower. Further, the conductive film is formed so that the glass sheet with a conductive film has a light transmittance of at least 79%, preferably at least 80%, with respect to incident light with a wavelength of 550 nm entering from the glass sheet side and the haze ratio in the wavelength is at least 4% when the glass sheet is a soda-lime silica glass sheet with a thickness of 5 mm. This substrate may be used particularly for a photoelectric conversion device with a thinner photoelectric conversion layer.

In the above-mentioned glass sheet with a conductive film, it also is preferred to form the conductive film on an undercoating film on the glass sheet. When the undercoating film is formed, diffusion of an alkaline component contained in the glass sheet into the conductive film can be suppressed. In addition, when the undercoating film is utilized as an anti-reflection film, the light transmittance of the glass sheet with a conductive film can be improved further.

Further, the present inventors found that when a relatively thick conductive film (with a thickness of at least 400 nm) was formed, in order to obtain the compatibility between a low light absorptance and a high haze ratio, the ratio of a total amount of oxygen and water vapor to tin atoms in a mixed gas was important in view of the pyrolytic reaction of the mixed gas.

A second method of manufacturing a glass sheet with a conductive film is one for manufacturing a glass sheet with a conductive film in which a conductive film having a thickness of at least 400 nm and containing tin oxide as a main component is formed on a glass sheet. In the second method, the conductive film is formed on glass, specifically, on a glass sheet or a glass ribbon during manufacture of a glass sheet by thermally decomposing (pyrolyzing) a mixed gas containing vapor of an organic tin compound, oxygen, and water vapor wherein a total amount of oxygen ($O_2$) and water vapor ($H_2O$) is at least 14 moles to one mole of tin atoms (Sn) contained in the organic tin compound.

In the mixed gas, the volume ratio (mole ratio) of the total amount of oxygen and water vapor to the vapor of an organic tin compound is at least 14 as long as the condition that one tin atom is contained per molecule of the organic tin compound is satisfied. For simplification, in the following description, considering that only one tin atom is contained per molecule of a generally used organic tin compound, the concentrations of gas components such as oxygen and the like are described using volume ratios of respective gas components to the vapor of an organic tin compound (for example, indicated as $O_2/Sn$) on the premise that the above condition is satisfied.

A fifth glass sheet with a conductive film of the present invention is manufactured by the above-mentioned manufacturing method. In this glass sheet with a conductive film, a conductive film with a thickness of at least 400 nm containing tin oxide as a main component is formed on a glass sheet. The glass sheet is obtained by forming, on glass, the conductive film with a mean absorptance of 4.5% or less in the wavelength region between 400 nm and 800 nm by thermally decomposing a mixed gas containing vapor of an organic tin compound, oxygen, and water vapor, wherein a total amount of oxygen and water vapor is at least 14 moles to one mole of tin atoms contained in the organic tin compound.

It is preferable that the glass sheet with a conductive film has a haze ratio of at least 2.0% in a wavelength of 550 nm.

The present invention also provides a photoelectric conversion device using one of the above-mentioned glass sheets with a conductive film. In this photoelectric conversion device, at least one photoelectric conversion unit and a back electrode are formed in this order on a conductive film of the glass sheet with a conductive film (the glass sheets with a conductive film obtained according to the above-mentioned manufacturing methods also can be used). This photoelectric conversion device is used with the glass sheet side positioned as the light incident side.

DETAILED DESCRIPTION OF THE INVENTION

Figure 1:
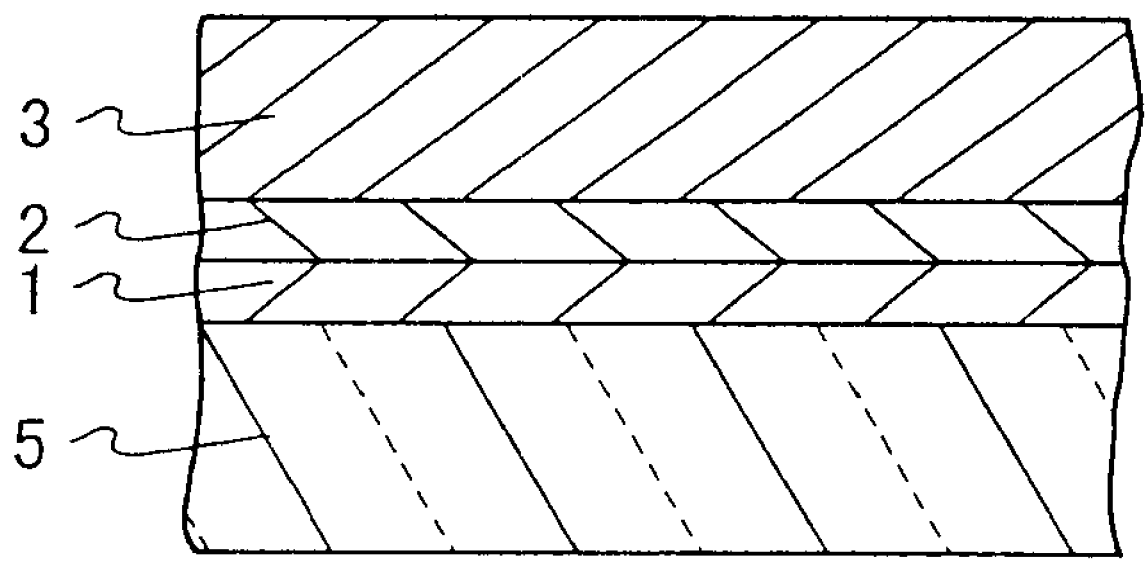
FIG. 1 is a sectional view showing an embodiment of a glass sheet with a conductive film according to the present invention.

Preferable embodiments of the present invention are described as follows.

Each of the above-mentioned conductive films is not particularly limited as long as it contains tin oxide as the main component, but specifically a fluorine doped tin oxide film ($SnO_2$:F film) is preferable as the conductive film. In this case, the main component denotes a component accounting for at least 50 wt. % in the film composition, as it usually means.

This conductive film may contain other trace components as long as their amounts are within a range allowing the aforementioned characteristics to be obtained. For instance, in order to improve the conductivity, antimony may be added. The conductive film may contain silicon, aluminum, zinc, copper, indium, bismuth, gallium, boron, vanadium, manganese, zirconium, or the like. However, it is preferable that the concentration of the trace components other than fluorine is 0.02 wt. % or lower.

As described later, chlorine is contained in a tin material that can be used suitably for forming a tin oxide film by a pyrolytic oxidation reaction. However, it is preferred to prevent chlorine from being contained in the conductive film in an amount exceeding a predetermined level. In the conductive film in the first glass sheet with a conductive film, a suitable chlorine concentration is 0.15 wt. % or lower, particularly 0.10 wt. % or lower. The chlorine concentration can be decreased by increasing the temperature employed for thermally decomposing raw materials or mixing water vapor into the raw materials.

In the second to fourth glass sheets with a conductive film, the chlorine concentration in each conductive film is suppressed to be in a low range. In the present invention, the chlorine concentration is not particularly limited. Generally, however, it is preferable that the chlorine concentration is suppressed to a level of 0.10 wt. % or lower.

However, chlorine is allowable as a component (>0 wt. %) to be introduced unavoidably from the raw materials.

Generally, it is preferable that the sheet resistance of the conductive film is, specifically, in the range between 5 Ω/sq. and 40 Ω/sq., particularly between 5 Ω/sq. and 30 Ω/sq. When this preferable range of the sheet resistance is taken into consideration, a suitable thickness of the conductive film is generally in the range between 300 nm and 1200 nm, particularly between 400 nm and 1000 nm.

Particularly, in an embodiment of the present invention, the thickness of the conductive film is secured to be at least 400 nm to increase the haze ratio by the growth of crystal grains of the tin oxide.

In an embodiment of the present invention, as described above, a predetermined fluorine concentration is secured and the sheet resistance is 20 Ω/sq. or lower. In this case, the sheet resistance can be decreased up to 18 Ω/sq. or lower.

A glass sheet with a conductive film may include films other than a conductive film. When a glass sheet containing an alkaline component such as a soda-lime glass sheet is used as a glass sheet, it is preferred to form an undercoating film between the glass sheet and the conductive film so as to prevent the conductivity from decreasing due to the diffusion of the alkaline component such as sodium contained in the glass, into the conductive film.

Preferable films as the undercoating film include a film containing, as the main component, an oxide of at least one metal selected from, for instance, silicon, aluminum, tin, titanium, and zirconium. Particularly, a film containing silicon oxide or aluminum oxide as the main component is suitable as the undercoating film. In the undercoating film, the main component may be an oxide containing at least two metals such as, for example, a silicon tin oxide (SiSnO). Other preferable examples of the undercoating film include a film containing oxycarbide or oxynitride of the above-mentioned metals, such as for instance silicon oxycarbide (SiOC), as the main component. Through the introduction of carbon or nitrogen, a refractive index of an oxycarbide film or an oxynitride film can be adjusted to be slightly higher than that of an oxide film. It is preferable that the thickness of the undercoating film is in the range between 5 nm and 100 nm.

The undercoating film is not limited to a single layer and may be formed of a plurality of layers. When the undercoating film is formed of a plurality of layers, it is preferable that the undercoating film includes, sequentially from the glass sheet side, for instance, a first undercoating layer containing tin oxide as the main component and a second undercoating layer containing an oxide of a metal selected from those described above as the main component. FIG. 1 shows a sectional view of a glass sheet with a conductive film including such a two-layer undercoating film. A preferable thickness of the first undercoating layer 1 (for instance, a tin oxide film) formed on a glass sheet 5 is in the range between 5 nm and 100 nm. A preferable thickness of the second undercoating layer 2 (for instance, a silicon oxide film) is in the range between 5 nm and 100 nm. Further, a preferable thickness of a conductive film 3 (for instance, a $SnO_2$:F film) is in the range between 300 nm and 1200 nm.

In forming a conductive film, a so-called physical deposition method such as a sputtering method, an ion plating method, a vacuum evaporation method, or the like may be used. However, it is preferred to use a so-called chemical deposition method such as a CVD method, a spray method, or the like. The physical deposition method is excellent in uniformity in film thickness. However, considering the producibility in mass-production or durability of a coating film, the chemical deposition method accompanied by a pyrolytic oxidation reaction of raw materials is superior.

Examples of the spray method include a solution spray method of spraying a solution containing a metallic compound on a high-temperature glass sheet, a dispersion spray method in which a dispersion obtained by dispersing fine grains of a metallic compound in a liquid is used instead of the above-mentioned solution, a powder spray method in which powder of a metallic compound is used instead of the above-mentioned solution, or the like. On the other hand, in the CVD method, a vapor for forming a coating film containing at least tin is used.

The spray method is advantageous in that it can be carried out with a relatively simple device, but a uniform film thickness cannot be obtained easily due to the difficulty in controlling droplets or products to be exhausted (a reaction product, an undecomposed product, or the like). In addition, distortion occurs in the glass. Therefore, as a method of forming a conductive film containing tin oxide as the main component, overall, the CVD method is superior to the other methods.

When using the CVD method, a conductive film can be formed by spraying a gaseous material on a glass sheet that has been cut to have a predetermined size and has been heated. For instance, the material is supplied while the glass sheet placed on a mesh belt is passed through a heating furnace, and the material is allowed to react on the surface of the glass sheet heated to a predetermined temperature, thus forming a conductive film.

However, in the formation of the conductive film by the CVD method, it is preferable that the conductive film is formed on a high-temperature glass ribbon in the manufacture of glass by a float glass process to utilize thermal energy in forming the glass. This preferable manufacturing method is advantageous in manufacturing a large area glass sheet with a conductive film and is particularly suitable for forming a conductive film used for a photoelectric conversion device, which may be required to be formed on a large area glass sheet used for a roofing material or the like. Particularly, when the CVD method is carried out inside a float bath, a film can be formed even on a glass surface having a temperature equal to or higher than the softening point, thus improving the film performance, the film growth rate, and the film formation reaction efficiency. In addition, defects such as pinholes can be suppressed.

In forming a conductive film, it is preferable that the temperature of a substrate such as a glass sheet is at least 590° C., particularly at least 615° C. The film formation at such a high temperature can be achieved easily by forming the film on a glass ribbon.

Figure 2:
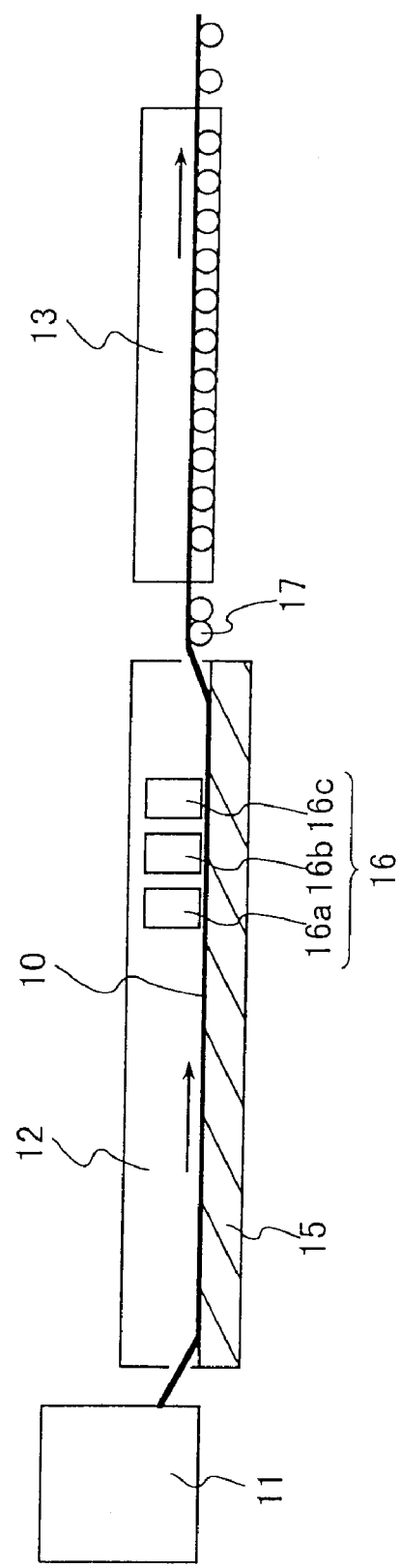
FIG. 2 is a view showing a configuration of a device that can be used for manufacturing a glass sheet with a conductive film according to the present invention.

FIG. 2 shows an embodiment of a device for forming a film by the CVD method on a glass ribbon in the float glass process. As shown in FIG. 2, in this device, a predetermined number of coaters 16 (three coaters 16a, 16b, and 16c in the embodiment shown in the figure) are placed inside a float bath 12 with a predetermined distance from the surface of a glass ribbon 10. The glass ribbon 10 is formed from molten glass, which is poured from a furnace 11 into a float bath 12, into a belt-like form on a tin bath 15 while traversing length of the float bath 12. These coaters supply gaseous materials to form coating films on the glass ribbon 10 continuously. When a plurality of coaters are used, an undercoating film and a conductive film can be formed on the glass ribbon 10 successively by the CVD method. The glass ribbon 10 on which coating films including a conductive film have been formed is lifted by a roller 17 and is carried into an annealing furnace 13. The glass ribbon 10 annealed in the annealing furnace 13 is cut to form a glass sheet with a predetermined size by a cutting device omitted in the figure.

The film formation on the glass ribbon may be carried out using the CVD method and the spray method together. For instance, by using the CVD method and the spray method in this order (for instance, by forming a film by the CVD method inside the float bath and a film by the spray method at a downstream location from the float bath in the moving direction of the glass ribbon), predetermined stacked layers may be obtained.

Examples of tin materials when using the CVD method include tin tetrachloride, dimethyltin dichloride, dibutyltin dichloride, tetramethyltin, tetrabutyltin, dioctyltin dichloride, monobutyltin trichloride, dibutyltin diacetate, or the like, and dimethyltin dichloride (DMT) and monobutyltin trichloride (MBTC) are particularly preferable. Oxidation materials used for obtaining tin oxide from a tin material include oxygen, water vapor, dry air, or the like. Fluorine materials include hydrogen fluoride, trifluoroacetic acid, bromotrifluoromethane, chlorodifluoromethane, or the like. When antimony is to be added, antimony pentachloride, antimony trichloride, or the like may be used.

Silicon materials used when a suitable silicon oxide film as an undercoating film is formed by the CVD method include silane (monosilane), disilane, trisilane, monochlorosilane, dichlorosilane, 1,2-dimethylsilane, 1,1,2-trimethyldisilane, 1,1,2,2-tetramethyl disilane, tetramethyl orthosilicate, tetraethyl orthosilicate, or the like. In this case, oxidation materials include oxygen, water vapor, dry air, carbon dioxide, carbon monoxide, nitrogen dioxide, ozone, or the like. When silane is used, for the purpose of preventing the silane from reacting before reaching the glass surface, an unsaturated hydrocarbon gas such as ethylene, acetylene, toluene, or the like may be used also.

Similarly, aluminum materials used when a suitable aluminum oxide film as an undercoating film is formed by the CVD method include trimethylaluminum, aluminum triisopropoxide, diethylaluminum chloride, aluminum acetylacetonate, aluminum chloride, or the like. In this case, oxygen, water vapor, dry air, or the like can be used as an oxidation material.

The following description is directed to a method of forming a conductive film having a low absorptance and a high haze ratio by the CVD method.

The size of crystal grains in a conductive film is affected considerably by oxygen and water in a mixed gas. When the amount of oxygen is too small, an organic tin compound (a tin material) is not oxidized enough and thus the crystal grains of the tin oxide do not grow sufficiently. When the oxygen concentration is too low, the light transmittance of the conductive film is decreased. Therefore, it is preferable that the oxygen concentration is set to satisfy $O_2/Sn \geq 10$. When $O_2/Sn \geq 10$, the haze ratio can be increased while a low absorptance is maintained, and further, unevenness in color can be suppressed. As shown in the following examples, when $(H_2O+O_2)/Sn \geq 14$ and $O_2/Sn \geq 10$, it also is possible to manufacture a glass sheet with a conductive film in which the absorptance is suppressed up to a degree achieving a total light transmittance of at least 80% while the haze ratio is at least 5%.

On the other hand, when the oxygen concentration is too high, excessive crystal nuclei are produced on a glass sheet in the initial stage in forming a conductive film, which may prevent individual crystal grains from growing well easily. Therefore, it is preferable that the oxygen concentration is set to satisfy $O_2O/Sn \leq 40$, further preferably $O_2/Sn \leq 35$.

When no water vapor exists in the mixed gas, the decomposition of the tin material does not progress easily. In order to promote the decomposition of the tin material, the concentration of water vapor is adjusted to satisfy $(H_2O+O_2)/Sn \geq 14$, preferably $(H_2O+O_2)/Sn \geq 30$ when the concentration of water vapor is indicated as a sum with the oxygen concentration.

On the other hand, when the concentration of water vapor is too high, a Sn—OH bond is formed, which might hinder the growth of crystal grains of tin oxide. Therefore, it is preferable that the following formula is satisfied: $(H_2O+O_2)/Sn \leq 70$, particularly $(H_2O+O_2)/Sn \leq 50$.

As an organic tin material used as a tin material, tetramethyltin, tetrabutyltin, or the like may be used, but an organic tin chloride containing chlorine is preferable. Examples of organic tin chlorides include dimethyltin dichloride (DMT), dibutyltin dichloride, dioctyltin dichloride, monobutyltin trichloride (MBTC), or the like.

Similarly in this case, it is better that a substrate supplying heat used for decomposing a mixed gas has a high temperature. Specifically, a preferable temperature of the glass when forming a conductive film containing tin oxide as the main component is at least 590° C., further preferably at least 620° C.

Figure 3:
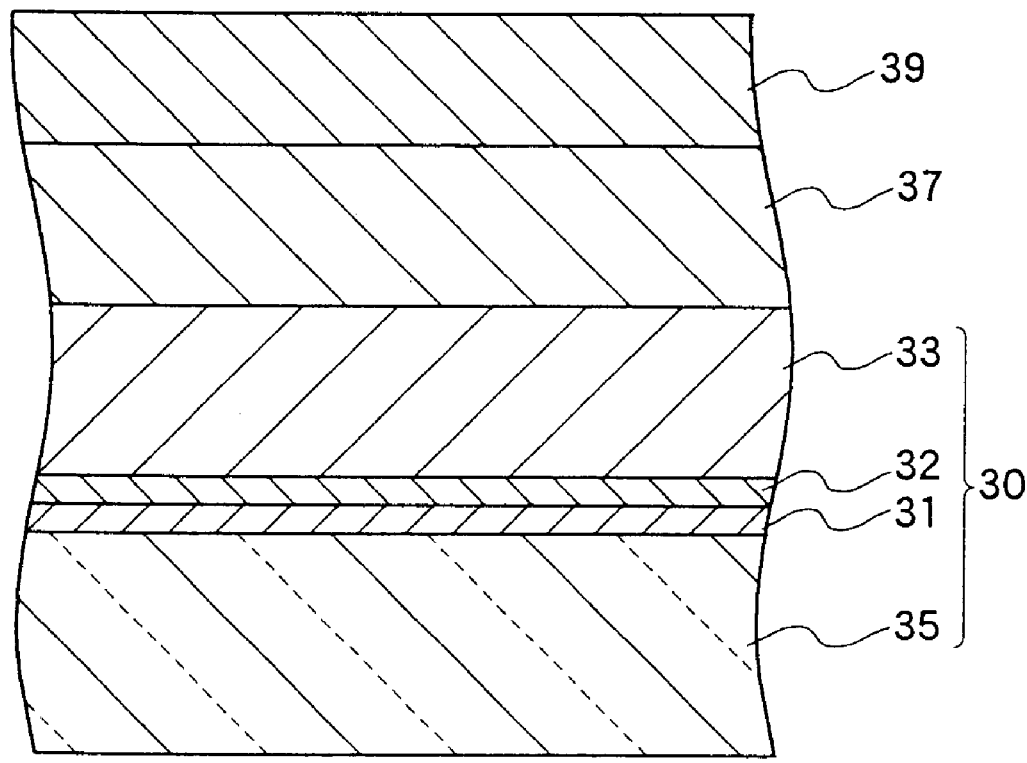
FIG. 3 is a sectional view showing an embodiment of a photoelectric conversion device according to the present invention.

The glass sheets with a conductive film of the present invention are suitable particularly as a substrate for a thin film photoelectric conversion device. FIG. 3 shows a sectional view of an embodiment of a thin film silicon-based photoelectric conversion device using a glass sheet with a conductive film of the present invention. In this photoelectric conversion device, on a glass sheet 30 with a conductive film in which undercoating films (first and second undercoating films 31 and 32) and a conductive film 33 are formed on a glass sheet 35 in this order, a photovoltaic unit 37 is formed and further a back electrode 39 is formed.

The photovoltaic unit can be formed as a single layer as shown in the figure, but a plurality of layers may be stacked to form the photovoltaic unit. Examples of the photovoltaic units include a unit in which an amorphous silicon-based thin film or a crystalline silicon-based thin film is used as a photovoltaic layer (hereinafter the unit is indicated by referring to the kind of photovoltaic layer, such as "an amorphous silicon-based thin film photovoltaic unit"or "a crystalline silicon-based thin film photovoltaic unit").

The amorphous silicon-based thin film photovoltaic unit can be formed by depositing respective p-type, i-type, and n-type semiconductor layers in this order by the plasma CVD method. Specifically, for example, it is formed by depositing a p-type microcrystalline silicon-based layer doped with at least 0.01 atom % boron as an impurity atom determining its conductive type, an intrinsic amorphous silicon layer to be a photovoltaic layer, and an n-type microcrystalline silicon-based layer doped with at least 0.01 atom % phosphorus as an impurity atom determining its conductive type in this order. However, these respective layers are not limited to those mentioned above. For instance, the impurity atom in the p-type microcrystalline silicon-based layer may be aluminum or the like, and an amorphous silicon-based layer may be used as the p-type layer. As the p-type layer, an alloy material of amorphous or microcrystalline silicon carbide, silicon germanium, or the like may be used.

It is preferable that the conductive type (p-type and n-type) microcrystalline silicon-based layers have a thickness in the range between 3 nm and 100 nm, further preferably between 5 nm and 50 nm.

It is preferable that the intrinsic amorphous silicon layer is formed by the plasma CVD method while the temperature of an undercoating is set to be 450° C. or lower. This layer is formed as a thin film of substantially an intrinsic semiconductor with a density of impurity atoms determining its conductive type of $1 \times 10^{18}$ $cm^{-3}$ or lower. It is preferable that the thickness of the intrinsic amorphous silicon layer is in the range between 0.05 $\mu$m and 0.5 $\mu$m. However, in an amorphous silicon-based thin film photovoltaic unit, an amorphous silicon carbide layer (for instance, an amorphous silicon carbide layer formed of amorphous silicon containing 10 atom % carbon or less) or an amorphous silicon germanium layer (for example, an amorphous silicon germanium layer formed of amorphous silicon containing 30 atom % germanium or less) of an alloy material may be formed instead of the intrinsic amorphous silicon layer.

Similarly, a crystalline silicon-based thin film photovoltaic unit can be formed by depositing respective p-type, i-type, and n-type semiconductor layers in this order by the plasma CVD method using the same procedure as that used for the amorphous silicon-based thin film photovoltaic unit.

It is preferable that the back electrode is formed by sputtering or vapor deposition of at least one metal layer formed of at least one material selected from Al, Ag, Au, Cu, Pt, and Cr. In addition, a layer formed of the conductive oxide such as ITO, $SnO_2$, ZnO, or the like may be formed between the photovoltaic unit and the metal electrode.

It is preferable that the photoelectric conversion device of the present invention includes a crystalline silicon-based thin film photovoltaic unit. The reason is that in this unit, an open circuit voltage and a short-circuit current density are lower and higher than those found in an amorphous silicon-based thin film photovoltaic unit, and therefore the light transmittance contributes to the conversion efficiency more than the sheet resistance in the conductive film on the glass sheet does.

In the present specification, even if amorphous portions are contained regionally, the state with a crystalline fraction in volume of at least 50% is taken as corresponding to a "crystalline" state. In addition to the amorphous or crystalline silicon, a semiconductor material containing at least 50 atom % silicon such as amorphous silicon germanium also is considered as the "silicon-based" material.

EXAMPLES

The present invention is described further in detail using examples as follows, but is not limited to the following examples.

Example A

Initially, specific examples of the first glass sheet with a conductive film and the first manufacturing method of the present invention are described.

The absorption coefficient of a conductive film and concentrations of elements such as fluorine and the like in the conductive film were measured as follows.

Measurement of Absorption Coefficient

Methylene iodide with a refractive index of 1.79 was applied to a conductive film deposited on a glass sheet, and a cover glass (#7059, made by Corning Inc.) with a thickness of 1 mm was allowed to adhere thereonto, thus producing a sample in which a scattering loss due to surface roughness of the conductive film was no longer caused. The transmittance and reflectance of this sample in the visible and near-infrared light region were measured using a spectrophotometer, and from the results the absorptance was determined. On the other hand, methylene iodide was applied to the glass sheet with no conductive film being formed and the cover glass was allowed to adhere thereonto, thus obtaining a reference sample. Similarly in this reference sample, the absorptance in the visible and near-infrared light region was determined as in the above. When the conductive film was formed on an undercoating film, one in which an undercoating film was formed under the same conditions was used as a reference sample. The absorption coefficient of the conductive film was determined by subtracting the absorptance of the reference sample from that of the sample and solving an equation in which multiple reflection is taken into consideration.

Measurement of Element Concentration

Fluorine concentration and chlorine concentration were calculated from the intensity of characteristic X-rays of an electron probe microanalyser. The ratio of carbon atoms to tin atoms was determined from the atomic concentration (%) calculated based on the peak areas of Sn3d5/2 and C1s using a relative sensitivity coefficient by X-ray photoelectron spectroscopic analysis.

In the following Examples 1 to 10, respective films including a conductive film were deposited by the CVD method using a device for depositing films on a glass ribbon as described above. Inside a float bath, 98 vol. % nitrogen and 2 vol. % hydrogen were supplied so that the pressure inside the bath was maintained to be slightly higher than that outside the bath, and thus the inside of the bath was maintained in a nonoxidative atmosphere. Into this float bath, soda-lime silica glass was introduced, which had a general flat glass composition and had been melted in a furnace. The glass ribbon annealed in an annealing furnace was cut at a further downstream location to have a predetermined size.

Example 1

From a coater positioned on the furthest upstream side, a mixed gas containing monosilane, ethylene, oxygen, and nitrogen was supplied to deposit a silicon oxide film with a thickness of about 30 nm on a glass ribbon. Subsequently, from a coater on the downstream side, a mixed gas containing dimethyltin dichloride (vapor), oxygen, water vapor, nitrogen, helium, methyl alcohol, and hydrogen fluoride was supplied to deposit a $SnO_2$:F film with a thickness of about 700 nm on the silicon oxide film. The methyl alcohol in the mixed gas was mixed for controlling the reaction of the tin material to adjust the chlorine concentration in the film, as does the water vapor. In depositing the $SnO_2$:F film, the glass ribbon had a temperature of about 650° C.

Example 2

The deposition of an undercoating film using a coater on the furthest upstream side was not carried out. From a coater on the downstream side, a mixed gas containing monobutyltin trichloride (vapor), oxygen, water vapor, nitrogen, helium, and trifluoroacetic acid was supplied to deposit a $SnO_2$:F film with a thickness of about 600 nm on a glass ribbon. In depositing the $SnO_2$:F film, the glass ribbon had a temperature of about 650° C.

Example 3

From a coater on the furthest upstream side, a mixed gas containing dimethyltin dichloride (vapor), oxygen, helium, and nitrogen was supplied to deposit a tin oxide film with a thickness of about 30 nm on a glass ribbon. Then, from a coater on the downstream side, a mixed gas containing monosilane, ethylene, oxygen, and nitrogen was supplied to deposit a silicon ioxide film with a thickness of about 30 nm on the tin oxide film. Subsequently, from a coater on the further downstream side, a mixed gas containing dimethyltin dichloride (vapor), oxygen, water vapor, nitrogen, and hydrogen fluoride was supplied to deposit a $SnO_2$:F film with a thickness of about 600 nm. In depositing the $SnO_2$:F film, the glass ribbon had a temperature of about 635° C.

Example 4

From a coater on the furthest upstream side, a mixed gas containing dimethyltin dichloride (vapor), oxygen, helium, and nitrogen was supplied to deposit a tin oxide film with a thickness of about 40 nm on a glass ribbon. Then, from a coater on the downstream side, a mixed gas containing monosilane, ethylene, oxygen, and nitrogen was supplied to deposit a silicon oxide film with a thickness of about 15 nm on the tin oxide film. Subsequently, from a coater on the further downstream side, a mixed gas containing dimethyltin dichloride (vapor), oxygen, water vapor, nitrogen, and hydrogen fluoride was supplied to deposit a $SnO_2$:F film with a thickness of about 650 nm. In depositing the $SnO_2$:F film, the glass ribbon had a temperature of about 641° C.

Example 5

From a coater on the furthest upstream side, a mixed gas containing dimethyltin dichloride (vapor), oxygen, helium, and nitrogen was supplied to deposit a tin oxide film with a thickness of about 35 nm on a glass ribbon. Then, from a coater on the downstream side, a mixed gas containing monosilane, ethylene, oxygen, and nitrogen was supplied to deposit a silicon oxide film with a thickness of about 20 nm on the tin oxide film. Subsequently, from a coater on the further downstream side, a mixed gas containing dimethyltin dichloride (vapor), oxygen, water vapor, nitrogen, and hydrogen fluoride was supplied to deposit a $SnO_2$:F film with a thickness of about 700 nm. In depositing the $SnO_2$:F film, the glass ribbon had a temperature of about 648° C.

Example 6

From a coater on the furthest upstream side, a mixed gas containing dimethyltin dichloride (vapor), oxygen, helium, and nitrogen was supplied to deposit a tin oxide film with a thickness of about 45 nm on a glass ribbon. Then, from a coater on the downstream side, a mixed gas containing monosilane, ethylene, oxygen, and nitrogen was supplied to deposit a silicon oxide film with a thickness of about 30 nm on the tin oxide film. Subsequently, from a coater on the further downstream side, a mixed gas containing dimethyltin dichloride (vapor), oxygen, water vapor, nitrogen, and hydrogen fluoride was supplied to deposit a $SnO_2$:F film with a thickness of about 750 nm. In depositing the $SnO_2$:F film, the glass ribbon had a temperature of about 637° C.

Example 7

From a coater on the furthest upstream side, a mixed gas containing dimethyltin dichloride (vapor), oxygen, helium, and nitrogen was supplied to deposit a tin oxide film with a thickness of about 35 nm on a glass ribbon. Then, from a coater on the downstream side, a mixed gas containing monosilane, ethylene, oxygen, and nitrogen was supplied to deposit a silicon oxide film with a thickness of about 25 nm on the tin oxide film. Subsequently, from a coater on the further downstream side, a mixed gas containing dimethyltin dichloride (vapor), oxygen, water vapor, nitrogen, and trifluoroacetic acid was supplied to deposit a $SnO_2$:F film with a thickness of about 900 nm. In depositing the $SnO_2$:F film, the glass ribbon had a temperature of about 651° C.

Example 8

From a coater on the furthest upstream side, a mixed gas containing monobutyltin trichloride (vapor), oxygen, helium, and nitrogen was supplied to deposit a tin oxide film with a thickness of about 85 nm on a glass ribbon. Then, from a coater on the downstream side, a mixed gas containing monosilane, ethylene, oxygen, and nitrogen was supplied to deposit a silicon oxide film with a thickness of about 7 nm on the tin oxide film. Subsequently, from a coater on the further downstream side, a mixed gas containing monobutyltin trichloride (vapor), oxygen, water vapor, nitrogen, helium, and hydrogen fluoride was supplied to deposit a $SnO_2$:F film with a thickness of about 480 nm. In depositing the $SnO_2$:F film, the glass ribbon had a temperature of about 645° C.

Example 9

From a coater on the furthest upstream side, a mixed gas containing monosilane, ethylene, oxygen, and nitrogen was supplied to deposit a silicon oxycarbide (SiOC) film with a thickness of about 65 nm on a glass ribbon. In this case, the rate of ethylene content was increased to introduce carbon into the film. Subsequently, from a coater on the downstream side, a mixed gas containing dimethyltin dichloride (vapor), oxygen, water vapor, nitrogen, and trifluoroacetic acid was supplied to deposit a $SnO_2$:F film with a thickness of about 550 nm. In depositing the $SnO_2$:F film, the glass ribbon had a temperature of about 640° C.

Example 10

From a coater on the furthest upstream side, a mixed gas containing monobutyltin trichloride (vapor), oxygen, helium, nitrogen, and tetraethoxysilane (vapor) was supplied to deposit a tin silicon oxide (SnSiO) film with a thickness of about 55 nm on a glass ribbon. Then, from a coater on the downstream side, a mixed gas containing tetraethoxysilane (vapor), oxygen, nitrogen, and monobutyltin trichloride (vapor) was supplied to deposit a silicon tin oxide (SiSnO) film with a thickness of about 35 nm on the tin silicon oxide film. Subsequently, from a coater on the further downstream side, a mixed gas containing dimethyltin dichloride (vapor), oxygen, water vapor, nitrogen, and hydrogen fluoride was supplied to deposit a $SnO_2$:F film with a thickness of about 430 nm. In depositing the $SnO_2$:F film, the glass ribbon had a temperature of about 655° C. The ratio of raw materials was adjusted so that the SnSiO film and the SiSnO film contain more tin atoms than silicon atoms and vice versa, respectively.

Comparative Example 1

Without using a coater inside the float bath, from a coater installed between the float bath and the annealing furnace, a mixed gas containing monobutyltin trichloride (vapor), oxygen, water vapor, nitrogen, helium, trifluoroacetic acid, and methyl alcohol was supplied to deposit a $SnO_2$:F film with a thickness of about 650 nm on a glass ribbon. In depositing the $SnO_2$:F film, the glass ribbon had a temperature of about 585° C.

Comparative Example 2

A soda-lime glass sheet that had been precut to have a size of 450 mm×450 mm and had a general flat glass composition was placed on a mesh belt and was passed through a heating furnace to be heated up to about 570° C. While this heated glass sheet was conveyed further, from a coater installed above a glass carrier line a mixed gas containing monosilane, oxygen, and nitrogen was supplied to deposit a silicon oxide film with a thickness of about 30 nm. Furthermore, from another coater installed above the glass carrier line on the downstream side, a mixed gas containing monobutyltin trichloride (vapor), oxygen, water vapor, nitrogen, and trifluoroacetic acid was supplied to deposit a $SnO_2$:F film with a thickness of about 600 nm.

Comparative Example 3

A tin oxide film, a silicon oxide film, and a $SnO_2$:F film having the same thicknesses as those in Example 3 were deposited in this order under substantially the same conditions as those in Example 3 except that the oxygen concentration was decreased considerably in depositing the $SnO_2$:F film. In depositing the $SnO_2$:F film, the glass ribbon had a temperature of about 615° C.

Comparative Example 4

A silicon oxide film and a $SnO_2$:F film having the same thicknesses as those in Comparative Example 2 were deposited in this order under substantially the same conditions as those in Comparative Example 2 except that the oxygen concentration and water vapor concentration were decreased in depositing the $SnO_2$:F film.

Comparative Example 5

A tin oxide film, a silicon oxide film, and a $SnO_2$:F film having the same thicknesses as those in Comparative Example 3 were deposited in this order under substantially the same conditions as those in Comparative Example 3 except that the water vapor concentration was varied in depositing the $SnO_2$:F film. In depositing the $SnO_2$:F film, the glass ribbon had a temperature of about 612° C.

Comparative Example 6

A silicon oxide film and a $SnO_2$:F film having the same thicknesses as those in Comparative Example 2 were deposited in this order under substantially the same conditions as those in Comparative Example 2 except that the oxygen concentration and water vapor concentration were varied in depositing the $SnO_2$:F film and 0.5 vol. % methyl alcohol was added. In depositing the $SnO_2$:F film, the glass ribbon had a temperature of about 564° C.

With respect to glass sheets with a conductive film obtained in the above examples and comparative examples, Tables 1 to 3 show the absorption coefficients of the conductive films, the concentrations of fluorine, chlorine, and methyl alcohol (MeOH) in the conductive films, the C/Sn atom ratios, the sheet resistance, and the concentrations of oxygen and water vapor in the gas for depositing the film.

TABLE 1

| | Absorption Coefficient (×10³) [cm⁻¹] | | | | | | | |
|---|---|---|---|---|---|---|---|---|
| | 400 nm | 500 nm | 600 nm | 700 nm | 800 nm | 900 nm | 1000 nm | 1100 nm |
| Example 1 | 0.94 | 0.61 | 0.50 | 0.59 | 0.71 | 0.82 | 0.94 | 1.09 |
| Example 2 | 0.56 | 0.39 | 0.25 | 0.25 | 0.28 | 0.31 | 0.38 | 0.46 |
| Example 3 | 1.03 | 0.58 | 0.41 | 0.42 | 0.48 | 0.63 | 0.79 | 0.98 |
| Example 4 | 0.49 | 0.36 | 0.24 | 0.25 | 0.27 | 0.29 | 0.35 | 0.41 |
| Example 5 | 0.47 | 0.36 | 0.23 | 0.24 | 0.27 | 0.29 | 0.36 | 0.42 |
| Example 6 | 0.54 | 0.42 | 0.30 | 0.29 | 0.31 | 0.35 | 0.39 | 0.44 |
| Example 7 | 0.62 | 0.44 | 0.33 | 0.32 | 0.36 | 0.41 | 0.46 | 0.62 |
| Example 8 | 0.44 | 0.32 | 0.22 | 0.23 | 0.25 | 0.27 | 0.32 | 0.39 |
| Example 9 | 0.46 | 0.34 | 0.22 | 0.23 | 0.25 | 0.28 | 0.35 | 0.42 |
| Example 10 | 0.45 | 0.35 | 0.22 | 0.23 | 0.25 | 0.28 | 0.34 | 0.42 |
| Comparative Example 1 | 1.33 | 0.77 | 0.55 | 0.52 | 0.56 | 0.70 | 0.85 | 1.02 |
| Comparative Example 2 | 1.23 | 0.75 | 0.63 | 0.79 | 0.97 | 1.18 | 1.42 | 1.69 |
| Comparative Example 3 | 1.31 | 0.83 | 0.61 | 0.58 | 0.74 | 0.90 | 1.06 | 1.23 |
| Comparative Example 4 | 1.28 | 0.73 | 0.52 | 0.48 | 0.65 | 0.82 | 0.99 | 1.24 |
| Comparative Example 5 | 1.39 | 1.21 | 1.02 | 1.17 | 1.36 | 1.56 | 1.78 | 2.04 |
| Comparative Example 6 | 1.34 | 0.83 | 0.60 | 0.65 | 0.85 | 1.06 | 1.27 | 1.50 |

TABLE 2

| | Fluorine Concentration (wt. %) | Chlorine Concentration (wt. %) | C/Sn (Atom Ratio) | Oxygen Concentration (vol. %) | Water Vapor Concentration (vol. %) | MeOH Concentration (vol. %) |
|---|---|---|---|---|---|---|
| Example 1 | 0.07 | 0.05 | 0.010 | 13.6 | 47.8 | 1.5 |
| Example 2 | 0.06 | 0.02 | 0.009 | 27.8 | 42.6 | — |
| Example 3 | 0.08 | 0.07 | 0.007 | 15.1 | 48.6 | — |
| Example 4 | 0.05 | 0.04 | 0.005 | 54.1 | 25.2 | — |
| Example 5 | 0.06 | 0.03 | 0.005 | 42.4 | 31.7 | — |
| Example 6 | 0.06 | 0.02 | 0.006 | 36.4 | 37.3 | — |
| Example 7 | 0.06 | 0.05 | 0.005 | 49.8 | 19.4 | — |

TABLE 2-continued

|  | Fluorine Concentration (wt. %) | Chlorine Concentration (wt. %) | C/Sn (Atom Ratio) | Oxygen Concentration (vol. %) | Water Vapor Concentration (vol. %) | MeOH Concentration (vol. %) |
|---|---|---|---|---|---|---|
| Example 8 | 0.05 | 0.04 | 0.006 | 52.5 | 28.6 | — |
| Example 9 | 0.06 | 0.02 | 0.005 | 46.6 | 33.7 | — |
| Example 10 | 0.05 | 0.03 | 0.004 | 47.5 | 29.6 | — |
| Comparative Example 1 | 0.07 | 0.11 | 0.17 | 10.0 | 40.3 | 1.5 |
| Comparative Example 2 | 0.17 | 0.14 | 0.008 | 18.9 | 35.7 | — |
| Comparative Example 3 | 0.07 | 0.07 | 0.02 | 5.4 | 48.5 | — |
| Comparative Example 4 | 0.12 | 0.3 | 0.011 | 15.1 | 30.3 | — |
| Comparative Example 5 | 0.30 | 0.06 | 0.010 | 5.4 | 35.7 | — |
| Comparative Example 6 | 0.18 | 0.28 | 0.010 | 15.1 | 30.3 | 0.5 |

TABLE 3

|  | Sheet Resistance (Ω/sq.) | Glass Temperature (° C.) |
|---|---|---|
| Example 1 | 6.5 | 650 |
| Example 2 | 18.9 | 655 |
| Example 3 | 13.9 | 635 |
| Example 4 | 14.8 | 641 |
| Example 5 | 13.1 | 648 |
| Example 6 | 12.6 | 637 |
| Example 7 | 9.8 | 651 |
| Example 8 | 24.8 | 645 |
| Example 9 | 21.4 | 640 |
| Example 10 | 27.6 | 655 |
| Comparative Example 1 | 11.8 | 585 |
| Comparative Example 2 | 9.5 | 570 |
| Comparative Example 3 | 12.7 | 615 |
| Comparative Example 4 | 9.2 | 570 |
| Comparative Example 5 | 7.6 | 612 |
| Comparative Example 6 | 8.8 | 564 |

In the above Table 1, the absorption coefficients are indicated per wavelength used for the measurement.

The conductive films obtained according to Examples 1 to 10 had an absorption coefficient of $1.2 \times 10^3$ cm$^{-1}$ or less in any wavelengths in the wavelength region between 400 nm and 1100 nm. The low absorption coefficients in this wavelength region are suitable particularly for a photoelectric conversion device with a crystalline silicon-based thin film photovoltaic unit. The conductive films obtained according to Examples 2 to 10 had an absorption coefficient of $0.7 \times 10^3$ cm$^{-1}$ or less in the wavelength region between 500 nm and 900 nm. Furthermore, the conductive films obtained according to Example 2 and Examples 4 to 10 had an absorption coefficient of $0.7 \times 10^3$ cm$^{-1}$ or less in the wavelength region between 400 nm and 1100 nm.

Example 11

On the conductive film of the glass sheet with a conductive film according to Example 2, an amorphous silicon photovoltaic unit was formed by the plasma CVD method, thus obtaining a thin film photoelectric conversion device. In the pin junction included in the amorphous silicon photovoltaic unit, a p-type amorphous silicon carbide layer and an n-type amorphous silicon layer were used and had thicknesses of 15 nm and 30 nm, respectively. An intrinsic amorphous silicon layer (i-type) was formed by a RF plasma CVD method. As film deposition conditions, a reacting gas of silane, a pressure inside a reaction chamber of about 40 Pa, a RF power density of 15 mW/cm$^2$, and a film deposition temperature of 150° C. were used. An intrinsic amorphous silicon film deposited directly on a glass substrate to have a thickness of 300 nm under the same film deposition conditions as those described above had a dark conductivity of $5 \times 10^{-10}$ S/cm. The thickness of the intrinsic amorphous silicon layer was set to be 300 nm. In the end, as a back electrode, an ITO film with a thickness of 80 nm and a Ag film with a thickness of 300 nm were deposited on the amorphous silicon photovoltaic unit by sputtering in this order.

The output characteristics of the thin film photoelectric conversion device (with a photovoltaic area of 1 cm$^2$) thus produced were measured while light of AM1.5 (100 mW/cm$^2$) was irradiated as incident light. The results included an open circuit voltage of 0.90V, a short-circuit current density of 16.0 mW/cm$^2$, a fill factor of 70.1%, and a conversion efficiency of 10.1%. Further, an optical degradation test was carried out by irradiating light of AM1.5 (100 mW/cm$^2$) at 48° C. After 550 hours irradiation, the conversion efficiency was deteriorated up to 8.3%.

Example B

Next, specific examples of the second to fourth glass sheets with a conductive film according to the present invention are described.

Haze ratios of the glass sheets with a conductive film and concentrations of elements such as fluorine in the conductive films were measured as follows.

Measurement of Haze Ratio

The haze ratio was measured using a spectrophotometer having an integrating sphere. The wavelength used for the measurement was 550 nm. The haze ratio was calculated from the ratio of diffuse transmittance to the total transmittance in this wavelength. In this case, light was allowed to enter the glass sheet from the surface opposite to the surface at which the film had been formed.

Measurement of Element Concentration

Fluorine concentration and chlorine concentration were calculated from the intensity of characteristic X-rays of an electron probe microanalyser.

Measurement of Glass Temperature

The temperature of a glass ribbon or a glass sheet in depositing a conductive film (a SnO$_2$:F film) was measured using a pyrometer at a location on a slightly upstream side from the place where the film was formed.

Similarly in the following respective examples, films including a conductive film were deposited on a glass ribbon by the CVD method using a device for depositing films on a glass ribbon as described above. Inside a float bath, 98 vol. % nitrogen and 2 vol. % hydrogen were supplied so that the pressure inside the bath was maintained to be slightly higher than that outside the bath during the film deposition, and thus the inside of the bath was maintained in a nonoxidative atmosphere. Into this float bath, soda-lime silica glass was introduced, which had a general flat glass composition and had been melted in the furnace. Then, after the film diposition, the glass ribbon annealed in an annealing furnace was cut by a cutting device positioned on the further downstream side. The thickness of the glass ribbon or a glass sheet was set to be 5 mm. The glass composition was a general flat glass composition (soda-lime silica glass). This glass had a transmittance of 90.5% and a refractive index of 1.52 in a wavelength of 550 nm. The following description is directed to a specific method of depositing films.

Example 12

From a coater positioned on the furthest upstream side, a mixed gas containing monosilane, ethylene, oxygen, and nitrogen was supplied to deposit a silicon oxide film with a thickness of about 30 nm on a glass ribbon. Subsequently, from a coater on the downstream side, a mixed gas containing dimethyltin dichloride (vapor), oxygen, water vapor, nitrogen, helium, methyl alcohol, and hydrogen fluoride was supplied to deposit a $SnO_2$:F film with a thickness of about 700 nm on the silicon oxide film.

Example 13

From a coater on the furthest upstream side, a mixed gas containing monosilane, ethylene, oxygen, and nitrogen was supplied to deposit a silicon oxide film with a thickness of about 30 nm on a glass ribbon. Subsequently, from a coater on the downstream side, a mixed gas containing monobutyltin trichloride (vapor), oxygen, water vapor, nitrogen, helium, and trifluoroacetic acid was supplied to deposit a $SnO_2$:F film with a thickness of about 600 nm on the silicon oxide film.

Example 14

From a coater on the furthest upstream side, a mixed gas containing dimethyltin dichloride (vapor), oxygen, helium, and nitrogen was supplied to deposit a tin oxide ($SnO_2$) film with a thickness of about 30 nm on a glass ribbon. Then, from a coater on the downstream side, a mixed gas containing monosilane, ethylene, oxygen, and nitrogen was supplied to deposit a silicon oxide film with a thickness of about 30 nm on the tin oxide film. Subsequently, from a coater on the further downstream side, a mixed gas containing monobutyltin trichloride (vapor), oxygen, water vapor, nitrogen, helium, methyl alcohol, and trifluoroacetic acid was supplied to deposit a $SnO_2$:F film with a thickness of about 700 nm on the silicon oxide film.

Example 15

A tin oxide film with a thickness of about 30 nm, a silicon oxide film with a thickness of about 30 nm, and a $SnO_2$:F film with a thickness of about 650 nm were deposited on a glass ribbon in this order under substantially the same conditions as those in Example 14 except that in the mixed gas used for depositing the $SnO_2$:F film, the methyl alcohol was not added and the water vapor concentration was increased.

Example 16

From a coater on the furthest upstream side, a mixed gas containing monobutyltin trichloride (vapor), oxygen, helium, and nitrogen was supplied to deposit a tin oxide ($SnO_2$) film with a thickness of about 65 nm on a glass ribbon. Then, from a coater on the downstream side, a mixed gas containing monosilane, ethylene, oxygen, and nitrogen was supplied to deposit a silicon oxide film with a thickness of about 7 nm on the tin oxide film. Subsequently, from a coater on the further downstream side, a mixed gas containing dimethyltin dichloride (vapor), oxygen, water vapor, nitrogen, and trifluoroacetic acid was supplied to deposit a $SnO_2$:F film with a thickness of about 450 nm on the silicon oxide film.

Example 17

From a coater on the furthest upstream side, a mixed gas containing monosilane, ethylene, oxygen, and nitrogen was supplied to deposit a SiOC film with a thickness of about 60 nm on a glass ribbon. In this case, the rate of ethylene content was increased to introduce carbon into the film. Subsequently, from a coater on the downstream side, a mixed gas containing dimethyltin dichloride (vapor), oxygen, water vapor, nitrogen, and trifluoroacetic acid was supplied to deposit a $SnO_2$:F film with a thickness of about 560 nm on the SiOC film.

Example 18

From a coater on the furthest upstream side, a mixed gas containing monobutyltin trichloride (vapor), oxygen, helium, nitrogen, and tetraethoxysilane (vapor) was supplied to deposit a tin silicon oxide (SnSiO) film with a thickness of about 55 nm on a glass ribbon. Then, from a coater on the downstream side, a mixed gas containing tetraethoxysilane (vapor), oxygen, nitrogen, and monobutyltin trichloride (vapor) was supplied to deposit a silicon tin oxide (SiSnO) film with a thickness of about 35 nm on the SnSiO film. Subsequently, from a coater on the further downstream side, a mixed gas containing dimethyltin dichloride (vapor), oxygen, water vapor, nitrogen, and hydrogen fluoride was supplied to deposit a $SnO_2$:F film with a thickness of about 480 nm on the SiSnO film. The ratio of raw materials was adjusted so that the SnSiO film and the SiSnO film contain more tin atoms than silicon atoms and vice versa, respectively.

Comparative Example 7

A soda-lime glass sheet that had been cut to have a size of 450 mm×450 mm and had a general flat glass composition was placed on a mesh belt and was passed through a heating furnace to be heated up to about 600° C. While this heated glass sheet was conveyed further, from a coater installed above a glass carrier line, a mixed gas containing monobutyltin trichloride (vapor), oxygen, water vapor, nitrogen, helium, methyl alcohol, and trifluoroacetic acid was supplied to deposit a $SnO_2$:F film with a thickness of about 700 nm.

Comparative Example 8

A soda-lime glass sheet that had been cut to have a size of 450 mm×450 mm and had a general flat glass composition was placed on a mesh belt and was passed through a heating furnace to be heated up to about 570° C. While this heated glass sheet was conveyed further, from a coater installed above a glass carrier line, a mixed gas containing monosilane, oxygen, and nitrogen was supplied to deposit a silicon oxide film with a thickness of about 30 nm on the glass sheet. Subsequently, from a coater positioned above the glass carrier line on the downstream side of the above-mentioned coater, a mixed gas containing monobutyltin trichloride (vapor), oxygen, water vapor, nitrogen, helium, and trifluoroacetic acid was supplied to deposit a $SnO_2$:F film with a thickness of about 730 nm.

Comparative Example 9

A soda-lime glass sheet with a general flat glass composition, to one surface of which a silicon oxide film had been applied by sputtering, was cut to have a size of 450 mm×450 mm. This glass sheet was placed on a mesh belt and was passed through a heating furnace to be heated up to about 630° C. While this heated glass sheet was conveyed further, from a coater installed above a glass carrier line, a mixed gas containing monobutyltin trichloride (vapor), oxygen, water vapor, nitrogen, helium, methyl alcohol, and trifluoroacetic acid was supplied to deposit a $SnO_2$:F film with a thickness of about 650 nm on the silicon oxide film.

With respect to the glass sheets with a conductive film (substrates for photoelectric conversion devices) obtained according to the above examples and comparative examples, Tables 4 and 5 show the concentrations of fluorine and chlorine in the conductive film, the sheet resistance, and the concentrations of oxygen, water vapor, and the like in the gas used for depositing the film.

TABLE 4

| | Chlorine Concentration (wt. %) | Fluorine Concentration (wt. %) | Haze Ratio (%) | Total Transmittance (%) | Water Vapor Concentration (vol. %) | MeOH Concentration (vol. %) |
|---|---|---|---|---|---|---|
| Example 12 | 0.008 | 0.07 | 8.3 | 80.8 | 47.6 | 2.1 |
| Example 13 | 0.07 | 0.07 | 11.6 | 79.1 | 51.1 | — |
| Example 14 | 0.04 | 0.06 | 6.9 | 80.4 | 48.6 | 1.5 |
| Example 15 | 0.012 | 0.05 | 5.2 | 81.1 | 49.5 | — |
| Example 16 | 0.07 | 0.08 | 4.2 | 82.8 | 43.6 | — |
| Example 17 | 0.03 | 0.06 | 4.8 | 81.6 | 46.5 | — |
| Example 18 | 0.05 | 0.06 | 4.3 | 82.4 | 45.8 | — |
| Comparative Example 7 | 0.16 | 0.09 | 9.7 | 78.9 | 32.0 | 1.5 |
| Comparative Example 8 | 0.30 | 0.11 | 3.4 | 78.4 | 35.5 | — |
| Comparative Example 9 | 0.18 | 0.06 | 4.7 | 78.8 | 37.6 | 1.5 |

TABLE 5

| | Sheet Resistance (Ω/sq.) | Glass Temperature (° C.) |
|---|---|---|
| Example 12 | 7.2 | 636 |
| Example 13 | 8.4 | 628 |
| Example 14 | 7.0 | 618 |
| Example 15 | 12.2 | 622 |
| Example 16 | 19.4 | 655 |
| Example 17 | 15.7 | 635 |
| Example 18 | 18.6 | 645 |
| Comparative Example 7 | 7.1 | 576 |
| Comparative Example 8 | 7.2 | 558 |
| Comparative Example 9 | 7.4 | 616 |

In the conductive films according to Examples 12 to 18, the chlorine concentration was 0.07 wt. % or lower, and the fluorine concentration was equal to or higher than the chlorine concentration. The light transmittance (total transmittance) in a wavelength of 550 nm was at least 79% and the haze ratio in the same wavelength was about 4% or higher (which was at least 5% in Examples 12 to 15). Furthermore, it also was possible to obtain a sheet resistance of about 20 Ω/sq. or lower (which was 8.5 Ω/sq. or lower in Examples 12 to 14).

Example 19

On the glass sheet with a conductive film according to Example 15, an amorphous silicon photovoltaic unit was formed by the plasma CVD method, thus obtaining a thin film photoelectric conversion device. In the pin junction included in the amorphous silicon photovoltaic unit, a p-type amorphous silicon carbide layer and an n-type amorphous silicon layer were used and had thicknesses of 15 nm and 30 nm, respectively. An intrinsic amorphous silicon layer (i-type) was formed by the RF plasma CVD method. As film deposition conditions, a reacting gas of silane, a pressure inside a reaction chamber of about 40 Pa, a RF power density of 15 mW/cm², and a film deposition temperature of 150° C. were used. An intrinsic amorphous silicon film deposited directly on a glass substrate to have a thickness of 300 nm under the same film deposition conditions as those described above had a dark conductivity of $5 \times 10^{-10}$ S/cm. The thickness of the intrinsic amorphous silicon layer was set to be 300 nm. In the end, as a back electrode, an ITO film with a thickness of 80 nm and a Ag film with a thickness of 300 nm were deposited by sputtering in this order.

The output characteristics of the thin film photoelectric conversion device (with a photovoltaic area of 1 cm²) thus produced were measured while light of AM1.5 (100 mW/cm²) was irradiated as incident light. The results included an open circuit voltage of 0.90V, a short-circuit current density of 16.1 mW/cm², a fill factor of 71.2%, and a conversion efficiency of 10.3%. Further, an optical degradation test was carried out by irradiating light of AM1.5 (100 mW/cm²) at 48° C. After 550 hours irradiation, the conversion efficiency was deteriorated up to 8.5%.

Example C

Specific examples of the fifth glass sheet with a conductive film and the second manufacturing method according to the present invention are described.

The light transmittance and the haze ratio of the glass sheet with a conductive film and the temperature of a glass ribbon in depositing the film were measured as follows.

Measurement of Light Transmittance and Determination of Color of Reflected Light The total transmittance in a wavelength of 550 nm was measured using a spectrophotometer having an integrating sphere. Similarly, diffuse transmittance was measured in the same wavelength. The haze ratio was calculated from the ratio of the diffuse transmittance to the total transmittance. In this case, light was allowed to enter the glass sheet from the surface opposite to the surface at which the film had been formed.

Measurement of Glass Ribbon Temperature

The temperature of a glass ribbon in depositing the conductive film was measured using a pyrometer at a location on a slightly upstream side from the place where the film was formed in a glass carrier line.

Measurement of Absorptance Methylene iodide with a refractive index of 1.79 was applied to a conductive film deposited on a glass sheet, and a cover glass (#7059, made by Corning Inc.) with a thickness of 1 mm was allowed to adhere thereonto, thus producing a sample in which a scattering loss due to surface roughness of the conductive film was no longer caused. The transmittance and reflectance in the visible light region of this sample were measured using a spectrophotometer, and from the results the absorptance was determined. On the other hand, methylene iodide was applied to the glass sheet with no conductive film being formed and the cover glass was allowed to adhere thereonto, thus obtaining a reference sample. Similarly in this reference sample, the absorptance in the visible light region was determined as in the above. When the conductive film was formed via an undercoating film, one in which an undercoating film was formed under the same conditions was used as a reference sample. The absorptance was determined by subtracting the absorptance of the reference sample from that of the sample. The absorptance of the conductive film was obtained by measuring the absorptance at intervals of 10 nm over the wavelength region between 400 nm and 800 nm and averaging the measurement values.

Similarly in the following respective examples and comparative examples, films including a conductive film were deposited on a glass ribbon by the CVD method using the same device as that shown in FIG. 2. Inside a float bath, 98 vol. % nitrogen and 2 vol. % hydrogen were supplied so that the pressure inside the bath was maintained to be slightly higher than that outside the bath during the film deposition, and thus the inside of the bath was maintained in a nonoxidative atmosphere. Into this float bath, soda-lime silica glass was introduced, which had a general flat glass composition and had been melted in the furnace. After the film deposition, the glass ribbon annealed in an annealing furnace was cut by a cutting device positioned on the further downstream side. The thickness of the glass ribbon or the glass sheet was set to be 4 mm. The glass composition was a general flat glass composition (soda-lime silica glass). The temperature of every glass ribbon in depositing the $SnO_2$:F film was set to be about 650° C. The following description is directed to a specific method of depositing films.

Example 20

From a coater positioned on the furthest upstream side, a mixed gas containing dimethyltin dichloride (vapor), oxygen, helium, and nitrogen was supplied to deposit a tin oxide film with a thickness of 30 nm on a glass ribbon. Subsequently, from a coater on the downstream side, a mixed gas containing monosilane, ethylene, oxygen, and nitrogen was supplied to deposit a silicon oxide film with a thickness of 30 nm on the tin oxide film. Subsequently, from a coater on the further downstream side, a mixed gas containing dimethyltin dichloride (vapor), oxygen, water vapor, nitrogen, and hydrogen fluoride was supplied to deposit a $SnO_2$:F film with a thickness of 720 nm on the silicon oxide film. In the mixed gas used for depositing the $SnO_2$:F film, the volume ratio ($O_2$(Sn) of oxygen to dimethyltin dichloride (vapor) and the volume ratio ($H_2O$/Sn) of water vapor to dimethyltin dichloride (vapor) were set to be 4.1 and 15.4, respectively.

Examples 21 to 26 and Comparative Examples 10 to 12

On a glass ribbon, respective films with the same thicknesses as those in Example 1 were deposited sequentially as in Example 1 except that the volume ratios of $O_2$/Sn and $H_2O$/Sn were varied variously in the mixed gas used for depositing the $SnO_2$:F film.

In the above-mentioned Examples 20 to 26 and Comparative Examples 10 to 12, the nitrogen concentration was adjusted so that the sum of the oxygen concentration, the water vapor concentration, and the nitrogen concentration was the same. The concentrations of the respective components other than those were not changed and remained the same.

With respect to the glass sheets with a conductive film thus obtained, Tables 6 and 7 show the gas conditions for depositing the films and the properties.

TABLE 6

| | (Mole Ratio (Volume Ratio)) | | |
|---|---|---|---|
| | $O_2$/Sn | $H_2O$/Sn | ($O_2 + H_2O$)/Sn |
| Example 20 | 4.1 | 15.4 | 19.5 |
| Example 21 | 2.4 | 13.9 | 16.3 |
| Example 22 | 5.6 | 10.4 | 16.0 |
| Example 23 | 12.1 | 9.1 | 21.2 |
| Example 24 | 17.0 | 15.7 | 32.7 |
| Example 25 | 33.6 | 15.7 | 49.3 |
| Example 26 | 19.4 | 21.3 | 40.7 |
| Comparative Example 10 | 4.0 | 8.0 | 12.0 |
| Comparative Example 11 | 0.9 | 8.7 | 9.6 |
| Comparative Example 12 | 0.2 | 9.2 | 9.4 |

TABLE 7

| | Total Transmittance (%) | Absorptance (%) | Haze Ratio (%) | Unevenness |
|---|---|---|---|---|
| Example 20 | 79.4 | 3.8 | 8.9 | A |
| Example 21 | 78.9 | 4.1 | 10.2 | A |
| Example 22 | 77.6 | 4.4 | 12.5 | A |
| Example 23 | 80.4 | 3.4 | 7.2 | A |
| Example 24 | 80.7 | 3.0 | 6.8 | A |
| Example 25 | 81.4 | 2.4 | 5.6 | A |
| Example 26 | 80.9 | 2.7 | 6.2 | A |
| Comparative Example 10 | 80.6 | 4.7 | 4.9 | B |
| Comparative Example 11 | 80.3 | 4.8 | 1.0 | B |
| Comparative Example 12 | 68.7 | 4.8 | 1.5 | B |

In Table 7, the unevenness was determined by visual check, and A indicates the case where no haze unevenness was observed in the film and B indicates the case where haze unevenness was observed in the film. In Examples 20 to 26, no haze unevenness was observed and the absorptance of the film (the $SnO_2$:F film with a thickness of 720 nm) was suppressed to be 4.4% or lower. Particularly, in Examples 23 to 26 employing a volume ratio of $O_2$/Sn of at least 10, the absorptance of the films was suppressed even to be 3.5% or less. Moreover, in the respective examples described above, a haze ratio of at least 5.0% also was obtained.

Further, in the same manner as in Example 20, glass sheets with a conductive film were manufactured with various types of undercoating films and various thicknesses of the $SnO_2$:F film.

Example 27

From a coater positioned on the furthest upstream side, a mixed gas containing dimethyltin dichloride (vapor), oxygen, helium, nitrogen and water vapor was supplied to deposit a tin oxide film with a thickness of 45 nm on a glass ribbon. Then, from a coater on the downstream side, a mixed gas containing monosilane, ethylene, oxygen, and nitrogen was supplied to deposit a SiOC film with a thickness of 10 nm on the tin oxide film. In this case, the rate of ethylene content was increased to introduce carbon into the film. Subsequently, from a coater on the further downstream side, a mixed gas containing monobutyltin trichloride (vapor), oxygen, water vapor, nitrogen, helium, and trifluoroacetic acid was supplied to deposit a $SnO_2$:F film with a thickness of 600 nm on the SiOC film. In the mixed gas used for depositing the $SnO_2$:F film, the volume ratio ($O_2$/Sn) of oxygen to monobutyltin trichloride (vapor) and the volume ratio ($H_2O$/Sn) of water vapor to monobutyltin trichloride (vapor) were set to be 22.5 and 17.4, respectively.

Example 28

From a coater positioned on the furthest upstream side, a mixed gas containing monobutyltin trichloride (vapor), oxygen, helium, nitrogen, and water vapor was supplied to deposit a tin oxide film with a thickness of 45 nm on a glass ribbon. Then, from a coater on the downstream side, a mixed gas containing tetraethoxysilane (vapor), oxygen, nitrogen, and monobutyltin trichloride (vapor) was supplied to deposit a SiSnO film with a thickness of 7 nm on the tin oxide film. Subsequently, from a coater on the further downstream side, a mixed gas containing dimethyltin dichloride (vapor), oxygen, water vapor, nitrogen, and trifluoroacetic acid was supplied to deposit a $SnO_2$:F film with a thickness of 540 nm on the SiSnO film. In the mixed gas used for depositing the $SnO_2$:F film, the volume ratio ($O_2$/Sn) of oxygen to dimethyltin dichloride (vapor) and the volume ratio ($H_2O$/Sn) of water vapor to dimethyltin dichloride (vapor) were set to be 15.8 and 23.8, respectively.

Example 29

From a coater positioned on the furthest upstream side, a mixed gas containing dimethyltin dichloride (vapor), oxygen, helium, and nitrogen was supplied to deposit a tin oxide film with a thickness of 25 nm on a glass ribbon. Then, from a coater on the downstream side, a mixed gas containing monosilane, ethylene, oxygen, and nitrogen was supplied to deposit a $SiO_2$ film with a thickness of 30 nm on the tin oxide film. Subsequently, from a coater on the further downstream side, a mixed gas containing dimethyltin dichloride (vapor), oxygen, water vapor, nitrogen, and hydrogen fluoride was supplied to deposit a $SnO_2$:F film with a thickness of 850 nm on the $SiO_2$ film. In the mixed gas used for depositing the $SnO_2$:F film, the volume ratio ($O_2$/Sn) of oxygen to dimethyltin dichloride (vapor) and the volume ratio ($H_2O$/Sn) of water vapor to dimethyltin dichloride (vapor) were set to be 34.5 and 18.5, respectively.

Example 30

From a coater positioned on the furthest upstream side, a mixed gas containing monobutyltin trichloride (vapor), oxygen, helium, nitrogen, and tetraethoxysilane was supplied to deposit a SnSiO film with a thickness of 55 nm on a glass ribbon. Then, from a coater on the downstream side, a mixed gas containing tetraethoxysilane (vapor), oxygen, nitrogen, and monobutyltin trichloride (vapor) was supplied to deposit a SiSnO film with a thickness of 35 nm on the SnSiO film. Subsequently, from a coater on the further downstream side, a mixed gas containing dimethyltin dichloride (vapor), oxygen, water vapor, nitrogen, and trifluoroacetic acid was supplied to deposit a $SnO_2$:F film with a thickness of 480 nm on the SiSnO film. In the mixed gas used for depositing the $SnO_2$:F film, the volume ratio ($O_2$/Sn) of oxygen to dimethyltin dichloride (vapor) and the volume ratio ($H_2O$/Sn) of water vapor to dimethyltin dichloride (vapor) were set to be 10.6 and 13.5, respectively. The raw material ratio was adjusted so that the SnSiO film and the SiSnO film contain more tin atoms than silicon atoms and vice versa, respectively.

With respect to the glass sheets with a conductive film obtained according to Examples 27 to 30, Tables 8 and 9 show the gas conditions for depositing the films and the properties.

TABLE 8

| | (Mole Ratio (Volume Ratio)) | | |
|---|---|---|---|
| | $O_2$/Sn | $H_2O$/Sn | ($O_2$ + $H_2O$)/Sn |
| Example 27 | 22.5 | 17.4 | 39.9 |
| Example 28 | 15.8 | 23.8 | 39.6 |
| Example 29 | 34.5 | 18.5 | 53.0 |
| Example 30 | 10.6 | 13.5 | 24.1 |

TABLE 9

| | Total Transmittance (%) | Absorptance (%) | Haze Ratio (%) | Unevenness |
|---|---|---|---|---|
| Example 27 | 81.9 | 2.3 | 5.1 | A |
| Example 28 | 82.7 | 2.2 | 4.6 | A |
| Example 29 | 77.8 | 4.4 | 14.6 | A |
| Example 30 | 83.5 | 2.2 | 4.3 | A |

As shown in Examples 27 to 30, even when the thickness of the $SnO_2$:F film was varied, a high haze ratio and a low absorptance were obtained as in Examples 20 to 26.

Example 31

On the glass sheet with a conductive film according to Example 20, an amorphous silicon photovoltaic unit was formed by the plasma CVD method, thus obtaining a thin film photoelectric conversion device. In the pin junction included in the amorphous silicon photovoltaic unit, a p-type amorphous silicon carbide layer and an n-type amorphous silicon layer were used and had thicknesses of 15 nm and 30 nm, respectively. An intrinsic amorphous silicon layer (i-type) was formed by the RF plasma CVD method. As film deposition conditions, a reacting gas of silane, a pressure inside a reaction chamber of about 40 Pa, a RF power density of 15 mW/cm², and a film deposition temperature of 150° C. were used. An intrinsic amorphous silicon film deposited directly on a glass substrate to have a thickness of 300 nm under the same film deposition conditions as those described above had a dark conductivity of $5 \times 10^{-10}$ S/cm. The thickness of the intrinsic amorphous silicon layer was set to be 300 nm. Finally, as a back electrode, an ITO film with a thickness of 80 nm and a Ag film with a thickness of 300 nm were deposited by sputtering in this order.

The output characteristics of the thin film photoelectric conversion device (with a photovoltaic area of 1 cm²) thus produced were measured while light of AM1.5 (100 mW/cm²) was irradiated as incident light. The results included an open circuit voltage of 0.89V, a short-circuit current density of 16.1 mW/cm², a fill factor of 72.5%, and a conversion efficiency of 10.4%. Further, an optical degradation test was carried out by irradiating light of AM1.5 (100 mW/cm²) at 48° C. After 550 hours irradiation, the conversion efficiency was degraded up to 8.6%.

As is apparent from the above embodiments and examples, the present invention can provide a photoelectric conversion device with a more excellent conversion efficiency than that in the conventional one and thus is extremely useful in the art. In addition, the glass sheets with a conductive film of the present invention also can exhibit excellent effects as, for example, a component for an image display unit, a duplicator, or the like, or a window glass or the like.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A glass sheet with a conductive film, comprising:
   a glass sheet; and
   a conductive film formed on the glass sheet, containing tin oxide as a main component,
   wherein the conductive film has an absorption coefficient of $1.2 \times 10^3$ cm$^{-1}$ or less in a wavelength region between 400 nm and 1100 nm,
   a fluorine concentration in the conductive film is in a range between 0.03 wt. % and 0.1 wt. %, and
   a ratio of carbon atoms to tin atoms in the conductive film is 0.015 or less.

2. The glass sheet a with a conductive film according to claim 1, wherein the conductive film has an absorption coefficient of $0.7 \times 10^3$ cm$^{-1}$ or less in a wavelength region between 500 nm and 900 nm.

3. The glass sheet with a conductive film according to claim 1, further comprising an undercoating film between the glass sheet and the conductive film.

4. The glass sheet with a conductive film according to claim 1, wherein a chlorine concentration in the conductive film is 0.10 wt. % or lower.

5. A glass sheet with a conductive film, comprising:
   a glass sheet;
   a conductive film formed on the glass sheet, containing tin oxide as a main component; and
   an undercoating film between the glass sheet and the conductive film,
   wherein a chlorine concentration in the conductive film is 0.11 wt. % or lower, and a fluorine concentration is equal to or higher than the chlorine concentration, and
   the conductive film is formed so that the glass sheet with a conductive film has a light transmittance of at least 79% with respect to incident light with a wavelength of 550 nm entering from a side of the glass sheet when the glass sheet is a soda-lime silica glass sheet with a thickness of 5 mm, and the conductive film has a sheet resistance of 20 Ω/sq. or lower.

6. The glass sheet with a conductive film according to claim 5, wherein the conductive film is formed so that the glass sheet with a conductive film has a haze ratio in the wavelength of at least 4% when the glass sheet is a soda-lime silica glass sheet with a thickness of 5 mm.

7. A glass sheet with a conductive film according to claim 5, wherein a fluorine concentration in the conductive film is at least 0.05 wt. %.

8. A glass sheet with a conductive film, comprising:
   a glass sheet; and
   a conductive film formed on the glass sheet, containing tin oxide as a main component and having a thickness of at least 400 nm,
   wherein the conductive film is formed by thermally decomposing a mixed gas containing vapor of an organic tin compound, oxygen, and water vapor, a total amount of the oxygen and the water vapor is at least 14 moles to one mole of tin atoms contained in the organic tin compound, and the conductive film has an average absorptance of 4.5% or less in a wavelength region between 400 nm and 800 nm.

9. The glass sheet with a conductive film according to claim 8, wherein a haze ratio in a wavelength of 550 nm is at least 2.0%.

10. The glass sheet with a conductive film according to claim 8, wherein the conductive film is formed on a glass ribbon during manufacture of the glass sheet.

11. The glass sheet with a conductive film according to claim 8, further comprising an undercoating film between the glass sheet and the conductive film.

12. A photoelectric conversion device, comprising:
    the glass sheet with a conductive film according to claim 1;
    at least one photoelectric conversion unit; and
    a back electrode,
    wherein the at least one photoelectric conversion unit and the back electrode are stacked on the conductive film in this order.

13. A photoelectric conversion device, comprising:
    the glass sheet with a conductive film according to claim 5;
    at least one photoelectric conversion unit; and
    a back electrode,
    wherein the at least one photoelectric conversion unit and the back electrode are stacked on the conductive film in this order.

14. A photoelectric conversion device, comprising:
    the glass sheet with a conductive film according to claim 8;
    at least one photoelectric conversion unit; and
    a back electrode,
    wherein the at least one photoelectric conversion unit and the back electrode are stacked on the conductive film in this order.

* * * * *

UNITED STATES PATENT AND TRADEMARK OFFICE
CERTIFICATE OF CORRECTION

PATENT NO. : 6,602,606 B1
DATED : August 5, 2003
INVENTOR(S) : Fujisawa et al.

It is certified that error appears in the above-identified patent and that said Letters Patent is hereby corrected as shown below:

<u>Title page,</u>
Item [73], Assignee, please add second Assignee as follows:
-- Kaneka Corporation, Osaka (JP) --

Signed and Sealed this

Fifteenth Day of June, 2004

JON W. DUDAS
*Acting Director of the United States Patent and Trademark Office*